United States Patent
Kikuchi et al.

(10) Patent No.: US 8,338,820 B2
(45) Date of Patent: Dec. 25, 2012

(54) SEMICONDUCTOR LIGHT EMITTING DEVICE

(75) Inventors: Takuo Kikuchi, Kanagawa-ken (JP); Hidehiko Yabuhara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/207,824

(22) Filed: Aug. 11, 2011

(65) Prior Publication Data

US 2012/0056156 A1    Mar. 8, 2012

(30) Foreign Application Priority Data

Sep. 6, 2010    (JP) .................................. 2010-199081

(51) Int. Cl.
*H01L 29/06*    (2006.01)

(52) U.S. Cl. .............. 257/13; 257/98; 257/99; 257/103; 257/E33.008

(58) Field of Classification Search .................... 257/13, 257/98, 99, 103, E33.008
See application file for complete search history.

(56) References Cited

FOREIGN PATENT DOCUMENTS

| JP | 10-270756 | 10/1998 |
|----|-----------|---------|
| JP | 2004-247563 | 9/2004 |
| JP | 2007-227671 | 9/2007 |
| JP | 2010-21287 | 1/2010 |
| JP | 2010-56282 | 3/2010 |
| KR | 10-2009-0019733 | 2/2009 |
| WO | WO 2009/005245 A2 | 1/2009 |
| WO | WO 2009/005245 A3 | 1/2009 |

OTHER PUBLICATIONS

Office Action issued Jul. 26, 2012 in Japanese Application No. 2010-199081 (With English Translation).
Office Action issued Sep. 21, 2012 in Korean Patent Application No. 10-2011-85571 (with English-language translation), 11 pages.

*Primary Examiner* — Tan N Tran
(74) *Attorney, Agent, or Firm* — Oblon, Spivak, McClelland, Maier & Neustadt, L.L.P.

(57) ABSTRACT

According to one embodiment, a semiconductor light emitting device includes a first conductivity type semiconductor layer, a light emitting layer and a second conductivity type semiconductor layer. The first conductivity type layer has a superlattice structure. First semiconductor layers and second semiconductor layers are alternately provided in the superlattice structure. The first semiconductor layers include a first nitride semiconductor and the second semiconductor layers include a second nitride semiconductor having a larger lattice constant than the first nitride semiconductor. The light emitting layer has a multi-quantum well structure. Quantum well layers and barrier layers are alternately provided in the multi-quantum well structure. The quantum well layers include a third nitride semiconductor having a smaller lattice constant than the second nitride semiconductor and the barrier layers include a fourth nitride semiconductor having a smaller lattice constant than the third nitride semiconductor. At least one of the quantum well layers has lattice spacing equal to the lattice constant of the third nitride semiconductor.

20 Claims, 10 Drawing Sheets

SEMICONDUCTOR LIGHT EMITTING DEVICE

CROSS-REFERENCE TO RELATED APPLICATIONS

This application is based upon and claims the benefit of priority from the prior Japanese Patent Application No. 2010-199081, filed on Sep. 6, 2010; the entire contents of which are incorporated herein by reference.

FIELD

Embodiments described herein relate generally to a semiconductor light emitting device.

BACKGROUND

In a semiconductor light emitting device such as a light emitting diode (LED), when a current is passed therein, light of various wavelengths can be generated by electron-hole recombination at the junction of p-type and n-type semiconductors. Semiconductor light emitting devices have longer lifetime, lower driving voltage, and lower power consumption than light emitting devices of the filament type. Furthermore, semiconductor light emitting devices have various advantages such as no lighting delay time, high vibration resistance, and high surge breakdown voltage. Thus, as an easy-to-use light source, the demand therefor keeps growing.

Recently, a light emitting device based on group III nitride semiconductor for emitting light in the blue, short wavelength region has been spotlighted as a light source for illumination. However, the light emitting device based on group III nitride semiconductor has not yet satisfied the cost performance required for light sources for general illumination, and is required to provide higher optical output.

The semiconductor light emitting device includes an n-type semiconductor layer, a p-type semiconductor layer, and a light emitting layer provided therebetween. The light emitting layer is based on a quantum well structure capable of achieving high light emission efficiency. The quantum well structure is composed of a quantum well and barrier layers. In the quantum well, electrons and holes are recombined to emit light. The barrier layers sandwich the quantum well to form a well-type potential. Furthermore, the light emission efficiency can be increased by using a multi-quantum well (MQW) structure in which a plurality of well layers and barrier layers are stacked.

In the case of a light emitting device made of a nitride semiconductor material, it is known that lattice strain due to difference in lattice constant occurs between the semiconductor layers constituting the MQW structure and generates a piezoelectric field. The problem is that this decreases the electron-hole recombination probability in the quantum well and decreases the light emission efficiency. Thus, there is demand for a semiconductor light emitting device capable of reducing the lattice strain of the quantum well and increasing the light emission efficiency.

BRIEF DESCRIPTION OF THE DRAWINGS

FIGS. 6A to 9B are schematic diagrams showing the variation of the lattice strain in the superlattice structure and the light emitting layer according to the embodiment;

DETAILED DESCRIPTION

In general, according to one embodiment, a semiconductor light emitting device includes a first conductivity type semiconductor layer, a light emitting layer and a second conductivity type semiconductor layer. The first conductivity type semiconductor layer includes a superlattice structure. First semiconductor layers and second semiconductor layers are alternately provided in the superlattice structure. The first semiconductor layers include a first nitride semiconductor and the second semiconductor layers include a second nitride semiconductor having a larger lattice constant than the first nitride semiconductor. The light emitting layer is provided on the first conductivity type semiconductor layer and has a multi-quantum well structure. Quantum well layers and barrier layers are alternately provided in the multi-quantum well structure. The quantum well layers include a third nitride semiconductor having a smaller lattice constant than the second nitride semiconductor and the barrier layers include a fourth nitride semiconductor having a smaller lattice constant than the third nitride semiconductor. At least one of the quantum well layers has lattice spacing equal to the lattice constant of the third nitride semiconductor. The second conductivity type semiconductor layer is provided on the light emitting layer.

Various embodiments will be described hereinafter with reference to the accompanying drawings. Like portions in the drawings are labeled with like reference numerals, and the detailed description thereof is omitted as appropriate. The different portions are described as appropriate. In the description of the following embodiments, it is assumed that the first conductivity type is n-type and the second conductivity type is p-type.

Figure 1:
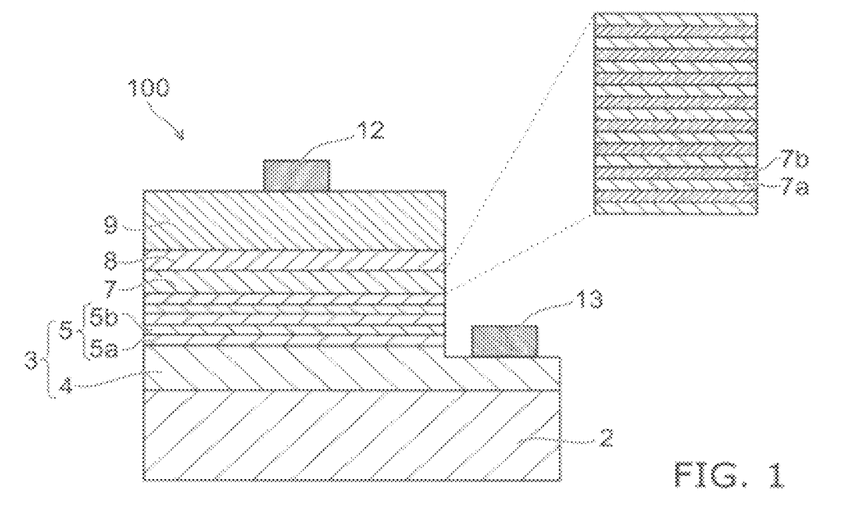
FIG. 1 is a schematic view showing the cross-sectional structure of a semiconductor light emitting device according to an embodiment.

FIG. 1 is a schematic view showing the cross-sectional structure of a semiconductor light emitting device 100 according to an embodiment.

The semiconductor light emitting device 100 is e.g. an LED made of nitride semiconductor and emitting blue light. The semiconductor light emitting device 100 includes an n-type semiconductor layer 3 provided on a substrate 2, a light emitting layer 7 provided on the n-type semiconductor layer, and a p-type semiconductor layer 9 provided on the light emitting layer 7.

The substrate 2 can be e.g. a sapphire substrate, GaN substrate, or SiC substrate.

The n-type semiconductor layer 3 has a superlattice structure 5 in which first semiconductor layers 5a and second semiconductor layers 5b are alternately stacked. The first semiconductor layer 5a includes a first nitride semiconductor. The second semiconductor layer 5b includes a second nitride semiconductor having a larger lattice constant than the first nitride semiconductor.

The light emitting layer 7 has an MQW structure in which quantum well layers 7b and barrier layers 7a are alternately stacked. The quantum well layer 7b includes a third nitride semiconductor having a smaller lattice constant than the second nitride semiconductor. The barrier layer 7a includes a fourth nitride semiconductor having a smaller lattice constant than the third nitride semiconductor.

The first to fourth nitride semiconductors can be $Al_xIn_yGa_{1-x-y}N$ ($0 \leq x \leq 1$, $0 \leq y \leq 1$, $0 \leq x+y \leq 1$) in different compositions. As an example of typical nitride semiconductors, GaN, $Al_xGa_{1-x}N$, and $In_xGa_{1-x}N$ can be used. Furthermore, as an n-type impurity, for instance, silicon (Si) can be used for doping.

The semiconductor light emitting device 100 is described with reference to an example using GaN for the first and fourth nitride semiconductors, $In_xGa_{1-x}N$ for the second nitride semiconductor, and $In_zGa_{1-z}N$ ($z<x$) for the third nitride semiconductor.

In the following, the configuration of the semiconductor light emitting device 100 is specifically described.

For instance, on a sapphire substrate 2, an n-type GaN layer 4 (contact layer) is provided via a buffer layer, not shown. The n-type GaN layer 4 can be formed as a high concentration layer having a thickness of approximately 2 μm, doped with Si, and having a carrier concentration of $1\text{-}5\times10^{18}$ cm$^{-3}$.

On the n-type GaN layer 4 is provided a superlattice structure 5 in which n-type GaN layers 5a and n-type $In_xGa_{1-x}N$ layers 5b (x=0.15-0.3) are alternately stacked. For instance, the thickness of the n-type GaN layer 5a is set to 1 nm, and the thickness of the $In_xGa_{1-x}N$ layer 5b is set to 3 nm. Thirty layers for each can be formed.

As described later, by using the superlattice structure 5, lattice strain due to difference in lattice constant between GaN and $In_xGa_{1-x}N$ can be relaxed.

On the superlattice structure 5 is provided a light emitting layer 7 in which GaN layers 7a and $In_zGa_{1-z}N$ layers 7b (z=0.1-0.15) are alternately stacked. The GaN layer 7a is a barrier layer, and can be formed with a thickness of 10-20 nm, for instance. The $In_zGa_{1-z}N$ layer 7b constitutes a quantum well between the GaN layers 7a, and can be formed with a thickness of 2-5 nm, for instance. With regard to the number of layers, four layers for each can be alternately stacked.

Also in the light emitting layer 7, lattice strain due to difference in lattice constant between GaN and $In_zGa_{1-z}N$ is relaxed in the stacking direction. The In ratio (z) in the $In_zGa_{1-z}N$ layer 7b of the light emitting layer 7 is made smaller than the In ratio (x) in the n-type $In_xGa_{1-x}N$ layer 5b of the superlattice structure 5. Thus, at least one of the $In_zGa_{1-z}N$ layers 7b can be configured so that the lattice spacing is equal to the lattice constant of $In_zGa_{1-z}N$ (or so that the difference between the lattice spacing and the lattice constant is approximated to 0 (zero)).

Here, the lattice constant means the lattice spacing in the case where each semiconductor crystal has no lattice strain.

On the light emitting layer 7, a p-type GaN layer 9 is provided via a p-type $Al_xGa_{1-x}N$ layer 8. As a p-type impurity, for instance, magnesium (Mg) can be used.

The p-type $Al_xGa_{1-x}N$ layer 8 is a semiconductor layer having a wider bandgap than GaN, and serves as a barrier against electrons flowing from the light emitting layer 7 to the p-type GaN layer 9. The p-type $Al_xGa_{1-x}N$ layer 8 thus provided can prevent electrons injected from the n-type semiconductor layer 3 into the light emitting layer 7 from overflowing into the p-type GaN layer 9. Thus, the electron-hole recombination efficiency in the light emitting layer 7 can be increased.

The superlattice structure 5, the MQW structure of the light emitting layer 7, and each nitride semiconductor layer described above can be epitaxially grown by using e.g. the MOCVD (metal organic chemical vapor deposition) method.

Next, a p-electrode 12 is provided on the p-type GaN layer 9. Furthermore, a mesa structure constituting a light emitting region is formed by e.g. the RIE (reactive ion etching) method. An n-electrode 13 is provided on the etching surface of the n-type semiconductor layer 3 exposed at the bottom surface of the mesa groove.

Figure 2A:
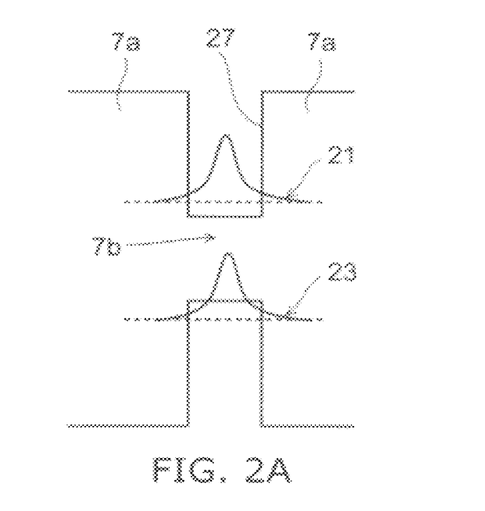
FIGS. 2A and 2B are schematic diagrams showing the band structure of the quantum well in the light emitting layer of the semiconductor light emitting device according to the embodiment.
Figure 2B:
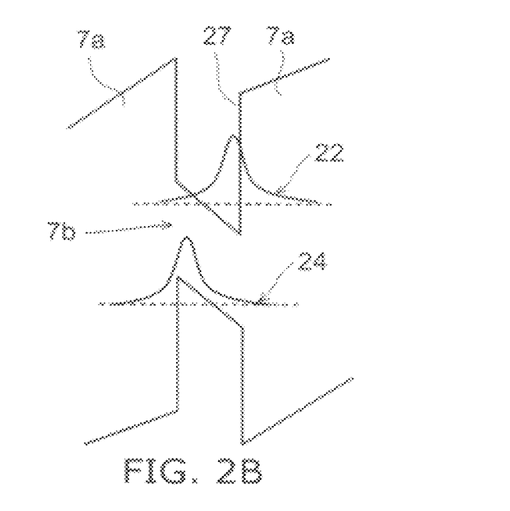

FIGS. 2A and 2B are schematic diagrams showing the band structure of the quantum well in the light emitting layer of the semiconductor light emitting device 100. FIG. 2A shows a band structure in the case where there is no lattice strain in the $In_zGa_{1-z}N$ layer 7b. FIG. 2B shows a band structure in the case where lattice strain occurs in the $In_zGa_{1-z}N$ layer 7b.

As shown in FIG. 2A, in the case where there is no lattice strain in the $In_zGa_{1-z}N$ layer 7b, the peak position of the electron wave function 21 in the quantum well 27 is matched with the peak position of the hole wave function 23.

On the other hand, in the case where the $In_zGa_{1-z}N$ layer 7b has lattice strain, a piezoelectric field is generated in the crystal and varies the band structure as shown in FIG. 2B. This causes the so-called Stark effect in which the electron wave function 22 and the hole wave function 24 in the quantum well are shifted, causing a mismatch between their peak positions.

Thus, as compared with the case where there is no lattice strain in the $In_zGa_{1-z}N$ layer 7b shown in FIG. 2A, the electron-hole recombination probability is lower and the light emission efficiency is lower in the case where the $In_zGa_{1-z}N$ layer 7b has lattice strain. Hence, to increase the optical output of the semiconductor light emitting device 100, it is desired to reduce the lattice strain of the quantum well 27.

Figure 3:
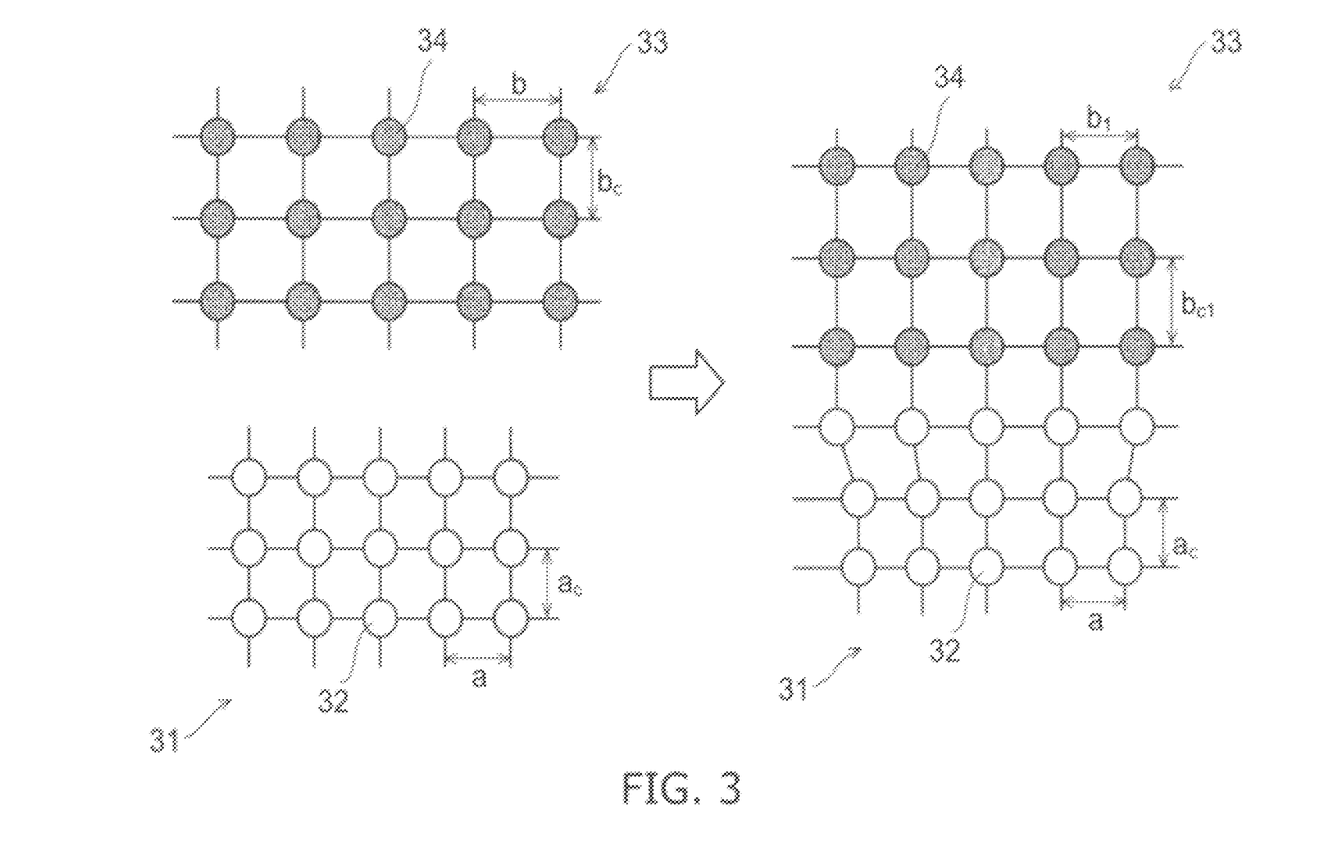
FIG. 3 schematically shows the lattice strain occurring in the case where two semiconductor layers having different lattice constants are stacked.

FIG. 3 schematically shows the lattice strain occurring in the case where a semiconductor layer 33 having lattice constant b is stacked on a semiconductor layer 31 having lattice constant a. For instance, if the semiconductor layers 31 and 33 are hexagonal, then a and b shown in the figure represent lattice spacings in the a-axis direction, and $a_c$ and $b_c$ represent lattice spacings in the c-axis direction.

As shown in FIG. 3, if the lattice constant a is smaller than b, then in the semiconductor layer 33 stacked on the semiconductor layer 31, the lattice spacing in the a-axis direction becomes $b_1$, smaller than b. On the other hand, the lattice spacing in the c-axis direction, $b_{c1}$, is made wider than $b_c$.

That is, atoms 32 constituting the semiconductor layer 31 are coupled to atoms 34 constituting the semiconductor layer 33. Hence, the semiconductor layer 33 is formed with lattice spacings different from the intrinsic lattice constants b and $b_c$, and results in having lattice strain.

Figure 4:
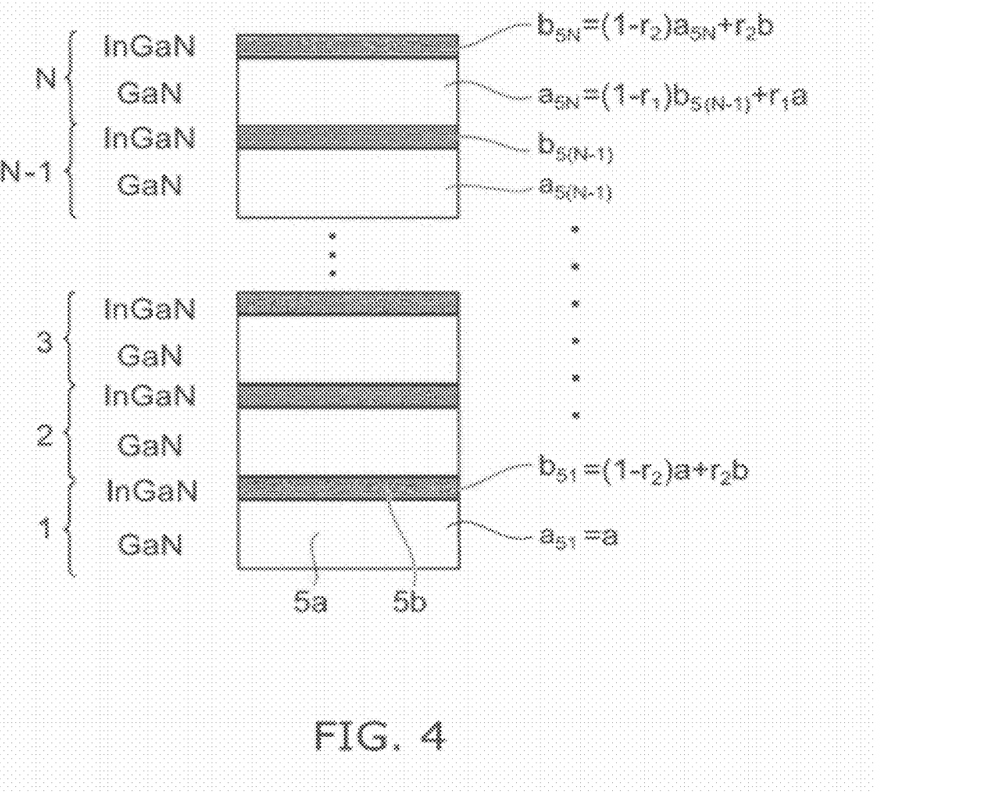
FIG. 4 is a schematic view showing the lattice spacing in the case where a plurality of GaN layers and $In_xGa_{1-x}N$ layers are alternately stacked.

FIG. 4 is a schematic view showing the lattice spacing in the case where a plurality of GaN layers and $In_xGa_{1-x}N$ layers are alternately stacked.

$In_xGa_{1-x}N$ is a mixed crystal of GaN (x=0) and InN (x=1). It is known that the lattice constant of GaN in the a-axis direction is 3.19 Å, and the lattice constant in the c-axis direction is 5.19 Å. On the other hand, the lattice constants of InN are 3.54 Å in the a-axis direction and 5.71 Å in the c-axis direction. According to Vegard's law, the lattice constant b in the a-axis direction and the lattice constant $b_c$ in the c-axis direction of $In_xGa_{1-x}N$ are given by the following equation.

$$b=3.19(1-x)+3.54x$$

$$b_c=5.19(1-x)+5.71x \quad (1)$$

For instance, the lattice constants b and $b_c$ monotonically increase with the In composition (x), and become larger as the In composition becomes larger.

Next, the lattice spacing of the superlattice structure is described.

As shown in FIG. 4, consider the structure in which GaN layers 5a and $In_xGa_{1-x}N$ layers 5b are stacked N periods (N=10-50).

The GaN layer 5a in the first layer (N=1) of the superlattice structure 5 has no lattice strain, and the lattice spacing $a_{51}$ is equal to the lattice constant of GaN. The lattice spacing $b_{51}$ of the $In_xGa_{1-x}N$ layer 5b stacked on the GaN layer 5a is given by the following equation:

$$a_{51}=a$$

$$b_{51}=(1-r_2)a_{51}+r_2 b \quad (2)$$

where $r_2$ is the strain relaxation coefficient of $In_xGa_{1-x}N$.

Next, the lattice spacing $a_{52}$ of the GaN layer 5a and the lattice spacing $b_{52}$ of the $In_xGa_{1-x}N$ layer 5b in the second layer (N=2) of the superlattice structure 5 are given by the following equation:

$$a_{52}=(1-r_1)b_{51}+r_1 a$$

$$b_{52}=(1-r_2)a_{52}+r_2 b \quad (3)$$

where $r_1$ is the strain relaxation coefficient of GaN.

Thus, the lattice spacing $a_{5N}$ of the GaN layer 5a and the lattice spacing $b_{5N}$ of the $In_xGa_{1-x}N$ layer 5b in the N-th layer of the superlattice structure 5 are given by the following equation.

$$a_{5N}=(1-r_1)b_{5(N-1)}+r_1 a$$

$$b_{5N}=(1-r_2)a_{5N}+r_2 b \quad (4)$$

Furthermore, the lattice spacing $a_{5N}$ of the GaN layer 5a and the lattice spacing $b_{5N}$ of the $In_xGa_{1-x}N$ layer 5b in the N-th layer of the superlattice structure 5 are given by the following equation.

$$a_{5N} = \left(a - \frac{ar_1+br_2(1-r_1)}{1-(1-r_1)(1-r_2)}\right)((1-r_1)(1-r_2))^{N-1} + \frac{ar_1+br_2(1-r_1)}{1-(1-r_1)(1-r_2)}$$

$$b_{5N} = \left(b_{51} - \frac{br_2+ar_1(1-r_2)}{1-(1-r_1)(1-r_2)}\right)((1-r_1)(1-r_2))^{N-1} + \frac{br_2+ar_1(1-r_2)}{1-(1-r_1)(1-r_2)} \quad (5)$$

In equation (5), the coefficients of the first terms satisfy the following relation.

$$a - \frac{ar_1+br_2(1-r_1)}{1-(1-r_1)(1-r_2)} < 0$$

$$b_{51} - \frac{br_2+ar_1(1-r_2)}{1-(1-r_1)(1-r_2)} < 0 \quad (6)$$

Hence, $a_{5N}$ and $b_{5N}$ increase with the increase of the number of stacked layers N.

For instance, if the number of stacked layers N tends to infinity, equation (5) converges to the following equation.

$$a_{5\infty} = \frac{ar_1+br_2(1-r_1)}{1-(1-r_1)(1-r_2)} \quad (7)$$

$$b_{5\infty} = \frac{br_2+ar_1(1-r_2)}{1-(1-r_1)(1-r_2)}$$

Hence, as the number of stacked GaN layers 5a and $In_xGa_{1-x}N$ layers 5b is increased, the lattice spacings $a_{5N}$ and $b_{5N}$ in the last layer on the light emitting layer 7 side asymptotically tend to $a_{5\infty}$ and $b_{5\infty}$ expressed in equation (7).

Next, the lattice spacing of the light emitting layer 7 is described.

The light emitting layer 7 is provided, for instance, continuously on the superlattice structure 5. GaN layers 7a and $In_zGa_{1-z}N$ layers 7b are alternately stacked in the light emitting layer 7. Although the number of stacked layers is smaller than in the superlattice structure 5, lattice strain due to lattice constant difference between the GaN layer 7a and the $In_zGa_{1-z}N$ layer 7b is relaxed in the stacking direction, and becomes smaller toward the p-type $Al_xGa_{1-x}N$ layer 8. For instance, the GaN layers 7a and the $In_zGa_{1-z}N$ layers 7b can be stacked 5-15 layers (N=5-15) for each.

The lattice spacing $a_{7N}$ of the GaN layer 7a and the lattice spacing $c_{7N}$ of the $In_zGa_{1-z}N$ layer 7b in the N-th layer of the light emitting layer 7 can be considered similarly to FIG. 4:

$$a_{7N} = \left(a_{sls} - \frac{ar_1+cr_2(1-r_1)}{1-(1-r_1)(1-r_2)}\right)((1-r_1)(1-r_2))^{N-1} + \frac{ar_1+cr_2(1-r_1)}{1-(1-r_1)(1-r_2)} \quad (8)$$

$$c_{7N} = \left(c_{71} - \frac{cr_2+ar_1(1-r_2)}{1-(1-r_1)(1-r_2)}\right)((1-r_1)(1-r_2))^{N-1} + \frac{cr_2+ar_1(1-r_2)}{1-(1-r_1)(1-r_2)}$$

$$a_{71} = a_{sls}$$

$$c_{71} = (1-r_2)a_{71}+r_2 c$$

where c is the lattice constant of $In_yGa_{1-y}N$ (y=0.1-0.15), and $r_2$ is the relaxation coefficient. The lattice constant $a_{71}$ of the GaN layer 7a in the first layer (N=1) of the light emitting layer 7 is equal to $a_{sls}$. That is, the GaN layer 7a in the first layer of the light emitting layer 7 is stacked on the last $In_xGa_{1-x}N$ layer 5b of the superlattice structure 5, and has lattice spacing $a_{5(N+1)}$. This lattice spacing is set to $a_{sls}$.

Furthermore, as the number of stacked layers N increases, the lattice spacing $a_{7N}$ of the GaN layer 7a and the lattice spacing $c_{7N}$ of the $In_zGa_{1-z}N$ layer 7b converge to the following equation.

$$a_{7\infty} = \frac{ar_1+cr_2(1-r_1)}{1-(1-r_1)(1-r_2)} \quad (9)$$

$$c_{7\infty} = \frac{cr_2+ar_1(1-r_2)}{1-(1-r_1)(1-r_2)}$$

Figure 5A:
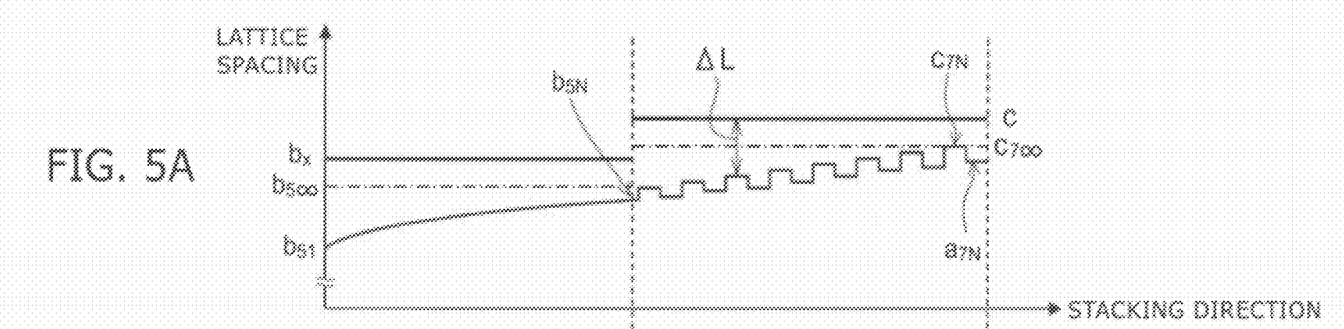
FIGS. 5A and 5B are schematic diagrams of the variation of lattice spacing in the stacking direction of the superlattice structure and the light emitting layer according to the embodiment.
Figure 5B:
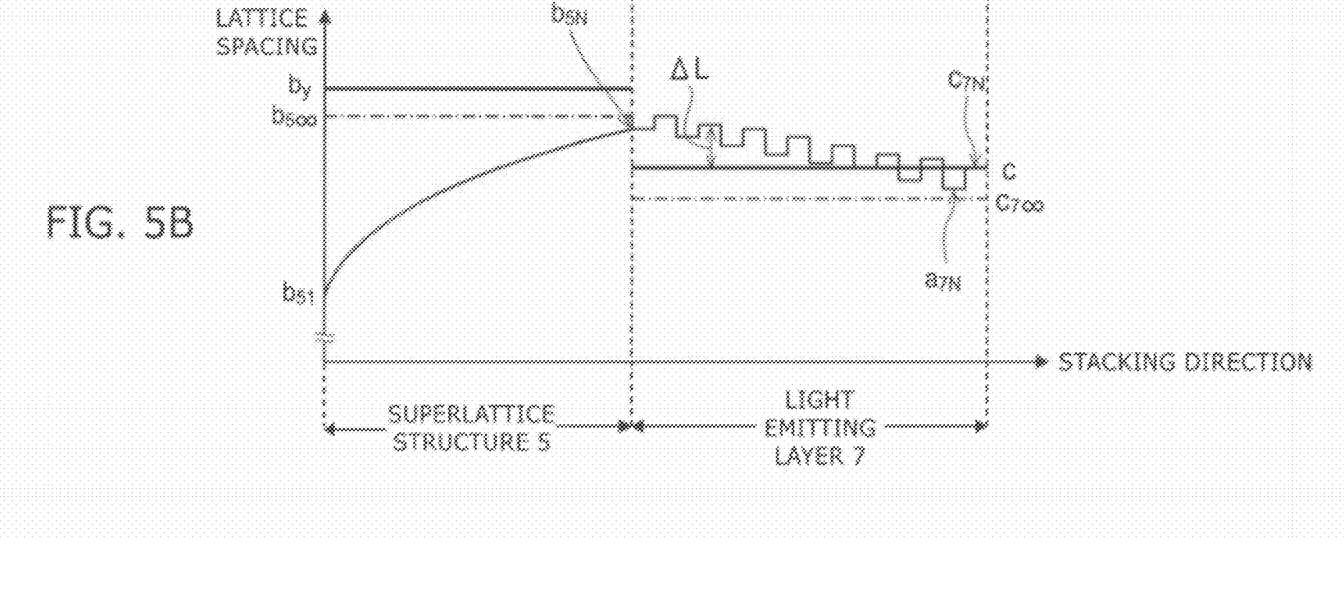

FIGS. 5A and 5B are schematic diagrams of the variation of lattice spacing in the stacking direction of the superlattice structure 5 and the light emitting layer 7 according to the embodiment.

In the example shown in FIG. 5A, the superlattice structure 5 has a configuration in which GaN layers 5a and $In_xGa_{1-x}N$ layers 5b are alternately stacked. On the other hand, the light emitting layer 7 has a configuration in which GaN layers 7a and $In_zGa_{1-z}N$ layers 7b are alternately stacked. Furthermore, the In composition (x) of the $In_xGa_{1-x}N$ layer 5b is smaller than the In composition (z) of the $In_zGa_{1-z}N$ layer 7b.

Hence, the lattice constant $b_x$ of the $In_xGa_{1-x}N$ layer 5b is smaller than the lattice constant c of the $In_zGa_{1-z}N$ layer 7b.

FIG. 5A schematically shows the variation of lattice spacing of the $In_xGa_{1-x}N$ layer 5b and the variation of lattice spacing of the GaN layer 7a and the $In_zGa_{1-z}N$ layer 7b in the light emitting layer 7 in the stacking direction.

As shown in FIG. 5A, the lattice spacing $b_{5N}$ of the $In_xGa_{1-x}N$ layer 5b and the lattice spacing $a_{5N}$ of the GaN layer 5a in the last layer of the superlattice structure 5 (at the edge on the light emitting layer 7 side) are related to $b_x$ and c as represented by the following relation.

$$b_{5N} < b_x < c$$

$$a_{5N} < b_x < c \tag{10}$$

That is, also in the last layer of the superlattice structure, the lattice spacing of the $In_xGa_{1-x}N$ layer 5b is smaller than the lattice constant of $In_xGa_{1-x}N$, and furthermore, smaller than the lattice constant of $In_zGa_{1-z}N$ of the light emitting layer 7.

Furthermore, the coefficients of the first terms of $a_{7N}$ and $c_{7N}$ in equation (8) satisfy the following relation.

$$a_{sls} - \frac{ar_1 + cr_2(1-r_1)}{1-(1-r_1)(1-r_2)} < 0 \tag{11}$$

$$c_{71} - \frac{cr_2 + ar_1(1-r_2)}{1-(1-r_1)(1-r_2)} < 0$$

That is, as shown in FIG. 5A, the lattice spacings of the GaN layer 7a and the $In_zGa_{1-z}N$ layer 7b in the light emitting layer 7 monotonically increase in the stacking direction.

However, also for $a_7$ and $c_7$ where the number of stacked layers N given by equation (9) tends to infinity, the following relation holds.

$$a_{7\infty} < c$$

$$c_{7\infty} < c \tag{12}$$

Thus, the lattice spacing of the $In_zGa_{1-z}N$ layer 7b of the light emitting layer 7 is smaller than the lattice constant c of $In_zGa_{1-z}N$. Hence, in the case where the In composition (x) of the $In_xGa_{1-x}N$ layer 5b is made smaller than the In composition (z) of the $In_zGa_{1-z}N$ layer 7b, the lattice strain ΔL of the $In_zGa_{1-z}N$ layer 7b cannot be set to zero in the light emitting layer 7. (In the following, the lattice strain ΔL means the difference between the lattice spacing and the lattice constant of the InGaN layer.)

In contrast, FIG. 5B shows an example in which the In composition (y) of the $In_yGa_{1-y}N$ layer 5b in the superlattice structure 5 is made larger than the In composition (z) of the $In_zGa_{1-z}N$ layer 7b of the light emitting layer 7.

In FIG. 5B, the lattice constant $b_y$ of $In_yGa_{1-y}N$ of the superlattice structure 5 is larger than the lattice constant c of $In_zGa_{1-z}N$ in the well layer 7b of the light emitting layer 7.

The In composition (y) of the $In_yGa_{1-y}N$ layer 5b and the number of stacked layers N of the superlattice structure 5 can be selected so that the lattice spacing $b_{5N}$ of the $In_xGa_{1-x}N$ layer 5b satisfies the following relation in the last layer of the superlattice structure 5.

$$c < b_{5N} < b_y \tag{13}$$

Furthermore, the coefficients of the first terms of $a_{7N}$ and $c_{7N}$ in equation (8) satisfy the following relation.

$$a_{sls} - \frac{ar_1 + cr_2(1-r_1)}{1-(1-r_1)(1-r_2)} > 0 \tag{14}$$

$$c_{71} - \frac{cr_2 + ar_1(1-r_2)}{1-(1-r_1)(1-r_2)} > 0$$

That is, as shown in FIG. 5B, the lattice spacings of the GaN layer 7a and the $In_zGa_{1-z}N$ layer 7b in the light emitting layer 7 monotonically decrease in the stacking direction and asymptotically tend to $a_{7\infty}$ and $c_{7\infty}$ expressed in relation (12). Thus, in the light emitting layer 7, the lattice spacing of the $In_zGa_{1-z}N$ layer 7b can be narrowed in the stacking direction to be matched with the lattice constant c of $In_zGa_{1-z}N$ (or to minimize the absolute value of the difference between the lattice spacing and the lattice constant c).

That is, as the number of stacked layers N from the superlattice structure 5 side is increased, the lattice spacing $c_{7N}$ of the $In_zGa_{1-z}N$ layer 7b asymptotically tends to $c_{7\infty}$, which is smaller than c. Hence, the k-th $In_zGa_{1-z}N$ layer 7b can be provided so as to satisfy $c_{7k} = c$, where the lattice strain ΔL can be set to zero. (Alternatively, the absolute value of the lattice strain ΔL can be minimized.)

For instance, in the example shown in FIG. 5B, in the last layer of the light emitting layer 7, the lattice spacing $c_{7N}$ of the $In_zGa_{1-z}N$ layer 7b is matched with the lattice constant c of $In_zGa_{1-z}N$.

Thus, in the superlattice structure in which GaN layers 5a and $In_yGa_{1-y}N$ layers 5b are alternately stacked, each lattice spacing can be made wider toward the light emitting layer 7. On the last layer side of the superlattice structure 5, the lattice spacing of the $In_yGa_{1-y}N$ layer 5b is made wider than the lattice spacing of the $In_zGa_{1-z}N$ layer 7b, which is a quantum well layer included in the light emitting layer 7. Furthermore, the lattice spacings of the $In_zGa_{1-z}N$ layer 7b and the GaN layer 7a (barrier layer) in the light emitting layer 7 can be narrowed toward the p-type $Al_xGa_{1-x}N$ layer 8.

Accordingly, the lattice spacing of the $In_zGa_{1-z}N$ layer 7b can be matched with the lattice constant of $In_zGa_{1-z}N$, and the lattice strain ΔL in the quantum well of the light emitting layer 7 can be set to zero. In a quantum well with the lattice strain ΔL set to zero, the piezoelectric field is suppressed, and the electron-hole recombination efficiency is increased. Hence, the light emission efficiency of the semiconductor light emitting device 100 can be increased.

(In the specification, the statement that "the lattice spacing of the $In_zGa_{1-z}N$ layer 7b is matched with, or equal to, the lattice constant of $In_zGa_{1-z}N$" is not limited to matching in the exact sense, but implies that the difference therebetween is small enough to suppress the piezoelectric field so that the electron-hole recombination efficiency can be increased.)

For instance, as shown in FIG. 5B, if the lattice strain ΔL is set to zero in the last quantum well layer of the light emitting layer 7, holes injected from the p-type $Al_xGa_{1-x}N$ layer 8 recombine with high-density electrons blocked in the last quantum well layer by the p-type $Al_xGa_{1-x}N$ layer 8 serving as a barrier. This can further increase the light emission efficiency.

FIGS. 6A to FIG. 9B are schematic diagrams showing simulation results for the lattice strain ΔL in the superlattice structure 5 and the light emitting layer 7. The vertical axis represents ΔL, and the horizontal axis represents thickness in the stacking direction. These figures show the variation of lattice strain ΔL when the In composition (x) of the $In_xGa_{1-x}N$ layer 5b, which is the second semiconductor layer of the superlattice structure 5, is varied as 0.04, 0.08, 0.16, and 0.2.

The In composition (z) of the $In_zGa_{1-z}N$ layer 7b included in the light emitting layer 7 is set to z=0.15. It is assumed that the first semiconductor layer of the superlattice structure 5 and the barrier layer of the light emitting layer 7 are GaN layers.

Figure 6A:
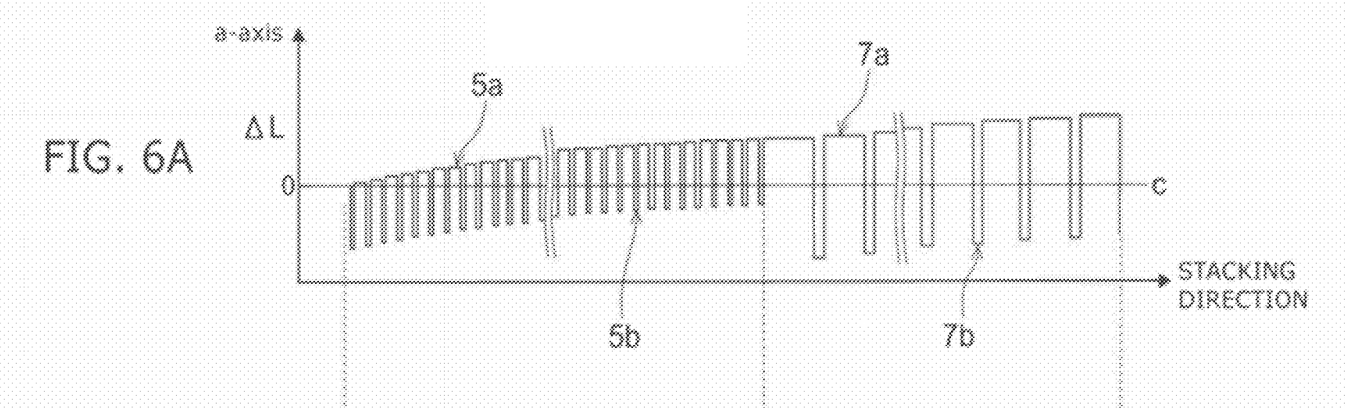
Figure 6B:
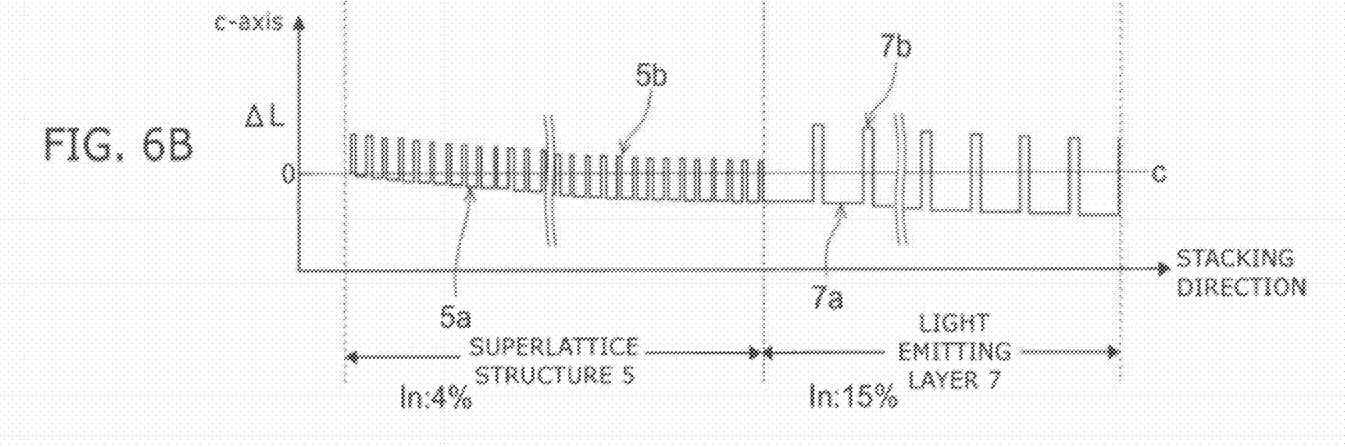

FIGS. 6A and 6B show the variation of ΔL for x=0.04. More specifically, FIG. 6A shows the lattice strain in the a-axis direction, and FIG. 6B shows the lattice strain in the c-axis direction.

In the a-axis direction shown in FIG. 6A, the lattice strain ΔL of the GaN layer 5a of the superlattice structure 5 is zero in the first layer where stacking is started. The lattice strain ΔL monotonically increases with the increase in the number of stacked layers. That is, as the number of layers increases, the lattice spacing of the GaN layer 5a is widened.

On the other hand, the $In_xGa_{1-x}N$ layer 5b in the first layer where stacking is started undergoes a large strain to the negative side. With the increase of stacked layers, ΔL on the negative side decreases. That is, as shown in the figure, the $In_xGa_{1-x}N$ layer 5b is initially formed with lattice spacing narrower than the lattice constant. Then, with the increase of stacked layers, the $In_xGa_{1-x}N$ layer 5b undergoes relaxation, and the lattice spacing is widened.

Next, turning to the light emitting layer 7, ΔL of the GaN layer 7 serving as a barrier layer increases continuously from the superlattice structure 5. On the other hand, the $In_zGa_{1-z}N$ layer 7b serving as a quantum well layer has a larger lattice constant than the $In_xGa_{1-x}N$ layer 5b. Hence, in the first layer, the $In_zGa_{1-z}N$ layer 7b undergoes a large strain to the negative side. Then, with the increase of stacked layers, the strain is relaxed, and ΔL on the negative side decreases, but does not reach zero.

The lattice strain in the c-axis direction shown in FIG. 6B exhibits an opposite behavior to the lattice strain in the a-axis direction. In the first layer of the GaN layer 5a, ΔL is zero. With the increase of stacked layers, ΔL increases to the negative side. That is, in the c-axis direction, with the increase of stacked layers, the lattice spacing of the GaN layer 5a is narrowed.

On the other hand, the $In_xGa_{1-x}N$ layer 5b in the first layer undergoes a large strain on the positive side. With the increase of stacked layers, ΔL decreases. That is, the $In_xGa_{1-x}N$ layer 5b is formed with a wider lattice spacing than the lattice constant, and then the lattice spacing is narrowed with the increase of stacked layers.

Turning to the light emitting layer 7, ΔL of the GaN layer 7 continuously increases to the negative side, and the lattice spacing is further narrowed. In the $In_zGa_{1-z}N$ layer 7b, ΔL once increases to the positive side, and then decreases with the increase of stacked layers. That is, in the first layer in the light emitting layer 7, the lattice spacing of the $In_zGa_{1-z}N$ layer 7b is widened, and then ΔL decreases under relaxation, but does not reach zero.

Figure 7A:
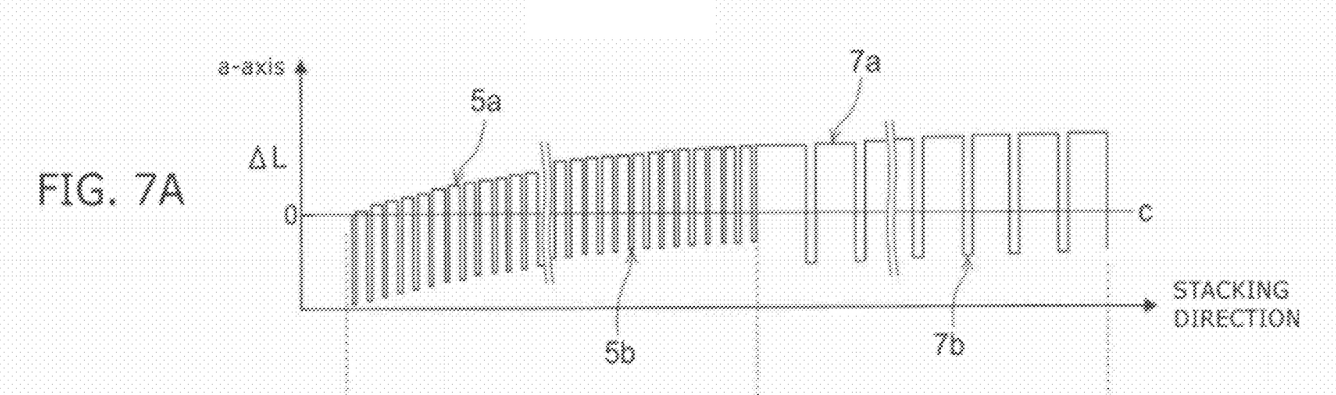

FIG. 7A shows the variation of ΔL in the a-axis direction for x=0.08. The trend of the variation of ΔL is the same as the result shown in FIG. 6A. However, the lattice strain of the superlattice structure 5 is increased by the amount of the larger lattice constant of the $In_xGa_{1-x}N$ layer 5b than in FIG. 6A. That is, ΔL of the first layer of the $In_xGa_{1-x}N$ layer 5b is increased to the negative side, and ΔL of the last layer of the GaN layer 5a is increased to the positive side.

In the light emitting layer 7, the strain of the GaN layer 7a and the $In_zGa_{1-z}N$ layer 7b is shifted to the positive side, and the variation in the stacking direction is smaller than in FIG. 6A.

Figure 7B:
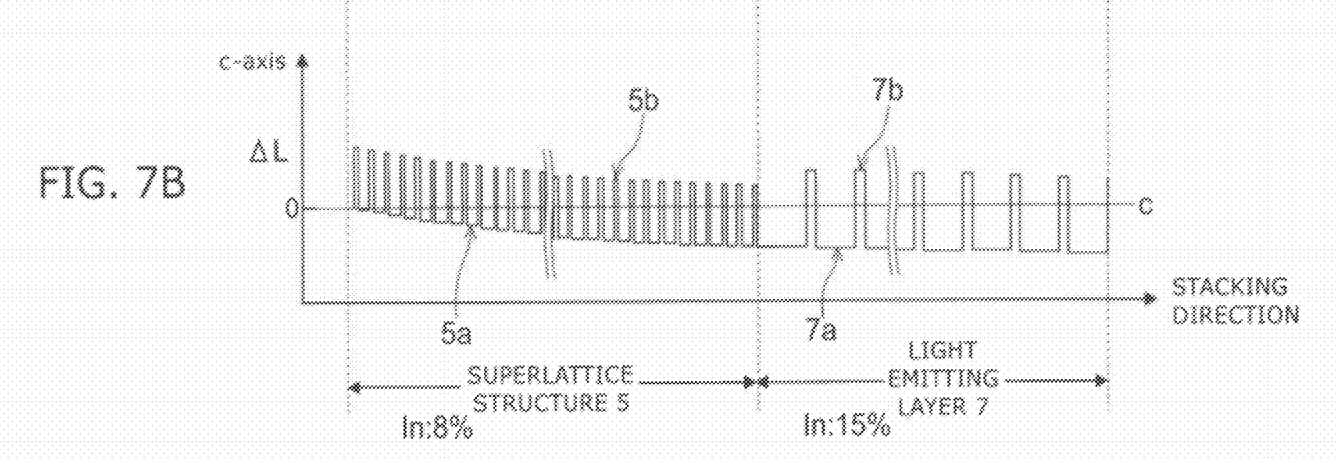

On the other hand, in the c-axis direction shown in FIG. 7B, the lattice strain exhibits an opposite trend to that in the a-axis direction shown in FIG. 7A. The lattice strain is increased by the amount of the larger lattice constant of the $In_xGa_{1-x}N$ layer 5b.

Figure 8A:
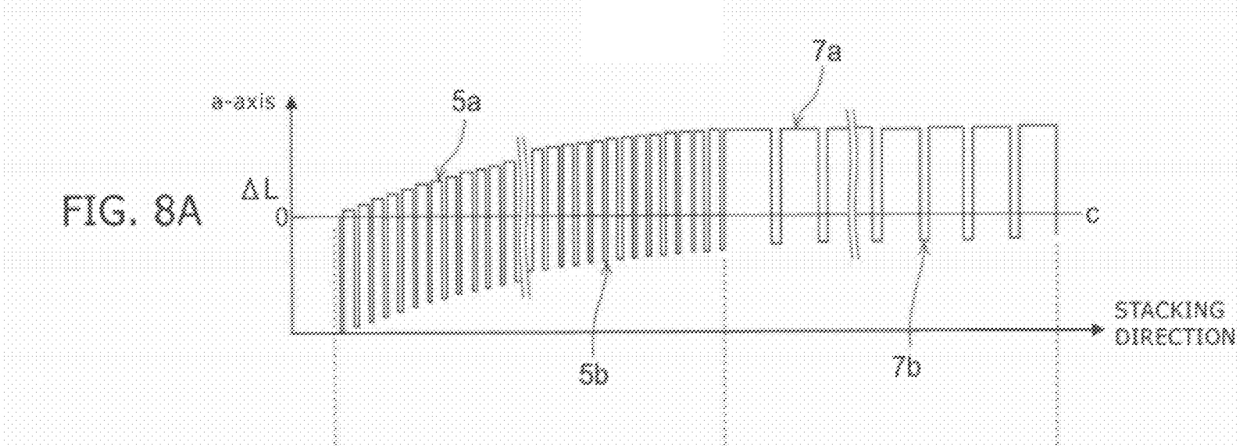
Figure 8B:
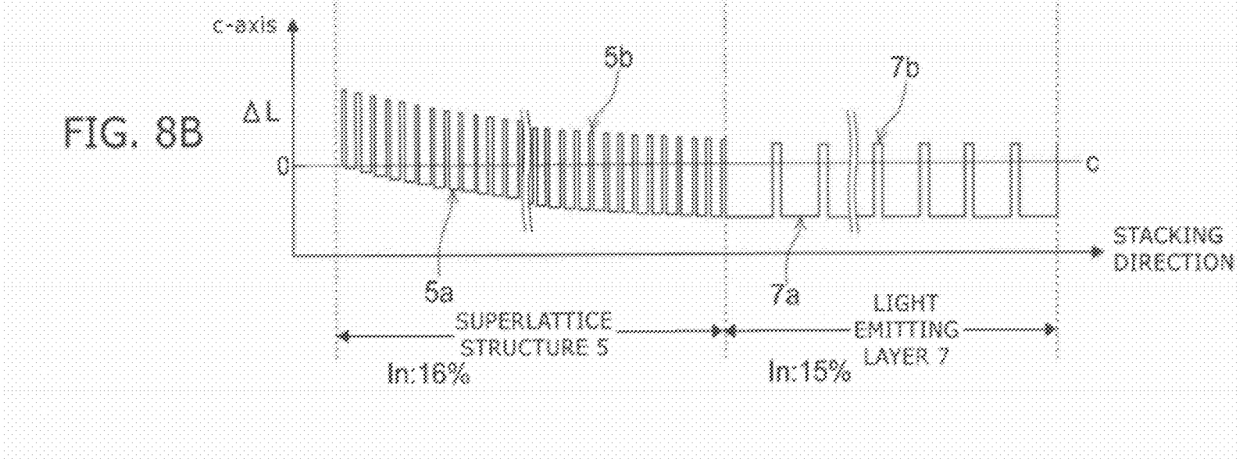

FIGS. 8A and 8B show the variation of lattice strain ΔL for x=0.16. The In ratio of the $In_xGa_{1-x}N$ layer 5b included in the superlattice structure 5 is nearly equal to the In ratio of the $In_zGa_{1-z}N$ layer 7b included in the light emitting layer 7.

In the a-axis direction shown in FIG. 8A, the $In_xGa_{1-x}N$ layer 5b in the first layer undergoes a large strain to the negative side. With the increase of stacked layers, ΔL on the negative side decreases under relaxation. Then, in the light emitting layer 7, ΔL of the $In_zGa_{1-z}N$ layer 7b is nearly constant.

That is, in the light emitting layer 7, the relaxation of strain continued from the superlattice structure 5 is saturated. Thus, it is considered that the lattice spacing of the $In_zGa_{1-z}N$ layer 7b becomes equal to $b_7$ given by equation (9).

On the other hand, the lattice strain ΔL continued from the GaN layer 5a to the GaN layer 7a is also saturated in the light emitting layer 7 and becomes equal to $a_{7c}$, given by equation (9).

Furthermore, also in the c-axis direction shown in FIG. 8B, although exhibiting an opposite variation to that in the a-axis direction, the lattice spacing in the light emitting layer 7 is saturated with a constant lattice strain ΔL.

Figure 9A:
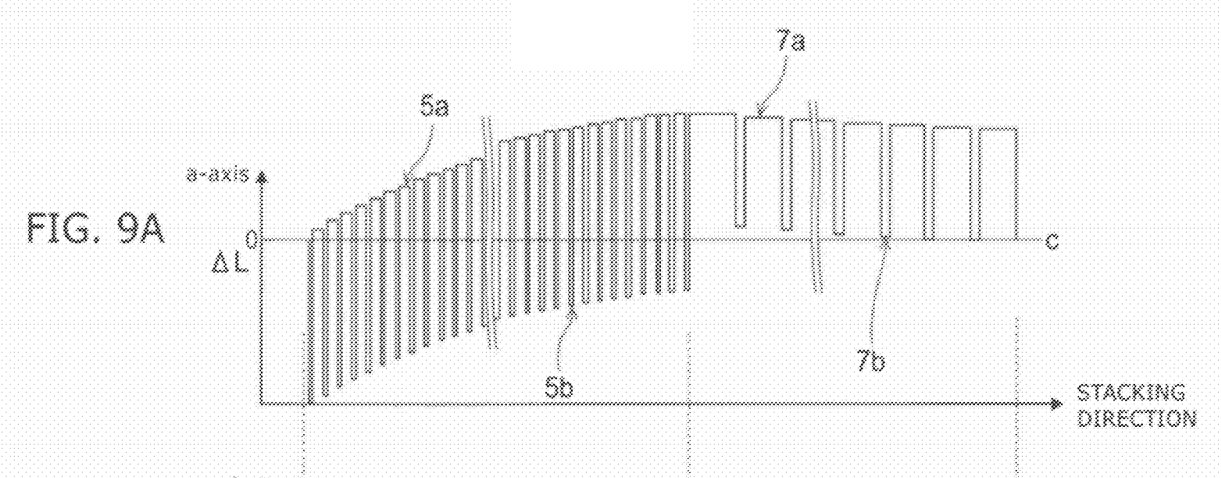
Figure 9B:
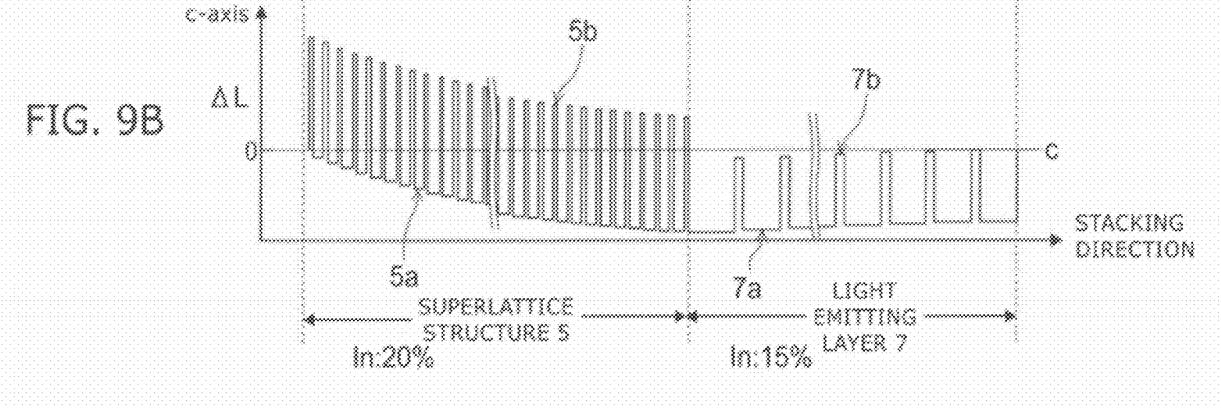

FIGS. 9A and 9B show the lattice strain for x=0.2, where the In ratio (x) of the $In_xGa_{1-x}N$ layer 5b is further increased.

As shown in FIG. 9A, by the amount of the increased lattice constant, the lattice strain ΔL of the first layer of the $In_xGa_{1-x}N$ layer 5b is increased to the negative side. With the increase of stacked layers, ΔL decreases by relaxation.

The lattice strain ΔL of the GaN layer 5a also increases with the increase of stacked layers, and is maximized in the last layer. Furthermore, with the increase of stacked layers in the light emitting layer 7, the lattice strain ΔL of the GaN layer 7a gradually decreases because the lattice constant of the $In_zGa_{1-z}N$ layer 7b is smaller than the lattice constant of the $In_xGa_{1-x}N$ layer 5b.

It is found that the lattice strain ΔL of the $In_zGa_{1-z}N$ layer 7b in the light emitting layer 7 occurs on the positive side in the first layer as a tensile strain in which the lattice spacing is widened. With the increase of stacked layers, ΔL decreases. Furthermore, it is found that ΔL reaches zero in the $In_zGa_{1-z}N$ layers 7b in the last layer and the preceding layer.

In the c-axis direction shown in FIG. 9B, the lattice strain of the $In_zGa_{1-z}N$ layer 7b occurs on the negative side, and ΔL decreases in the stacking direction. As in the a-axis direction, ΔL reaches zero in the $In_zGa_{1-z}N$ layers 7b in the last layer and the preceding layer.

As shown in FIGS. 5B, 9A, and 9B, by making the In ratio (x) of the $In_xGa_{1-x}N$ layer 5b included in the superlattice structure 5 larger than the In ratio (z) of the $In_zGa_{1-z}N$ layer 7b included in the light emitting layer 7, the lattice spacing in the last layer of the superlattice structure 5 can be made wider than the lattice spacing of the light emitting layer 7. This causes a tensile strain in the quantum well layer on the superlattice structure side of the light emitting layer 7, and then relaxes the lattice strain in the stacking direction. Thus, quantum well layers free from lattice strain can be formed.

Figure 10:
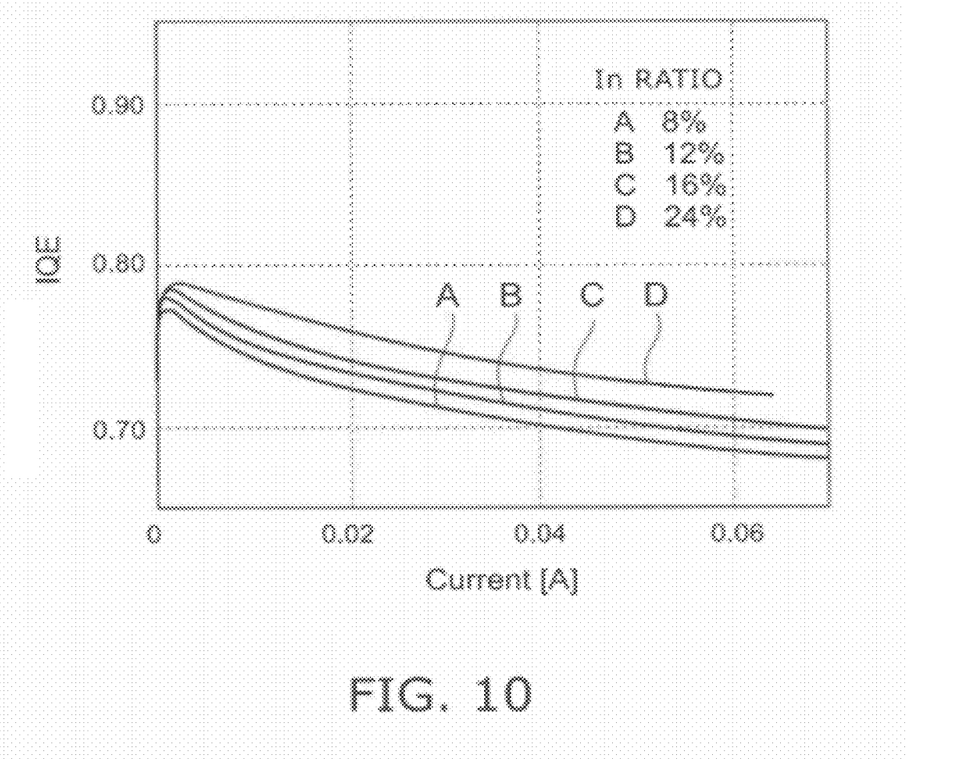
FIG. 10 is a graph showing the internal quantum efficiency of the semiconductor light emitting device according to the embodiment.

FIG. 10 is a graph showing a simulation result on internal quantum efficiency (IQE) of the semiconductor light emitting device 100. The vertical axis represents IQE, and the horizontal axis represents current. The light emission wavelength is set to 450 nm, and the temperature is set to 300 K. Such effects as crystal defects of nitride semiconductor layers are not taken into consideration. The simulation result reflects the band structure of the superlattice structure 5 and the light emitting layer 7.

It is found that IQE is increased by increasing the In ratio (x) of the $In_xGa_{1-x}N$ layer 5b included in the superlattice structure 5 from 0.08 to 0.24. For instance, at a current of 0.02 A, IQE for x=0.24 is higher by approximately 4% than IQE for x=0.08.

IQE corresponds to the electron-hole recombination efficiency. FIG. 10 shows that the light emission efficiency can be increased by increasing the In ratio (x) of the $In_xGa_{1-x}N$ layer 5b.

This indicates the effect of increasing the electron-hole recombination probability by eliminating the lattice strain in the quantum well layer of the light emitting layer 7 to suppress the piezoelectric field.

Figure 11A:
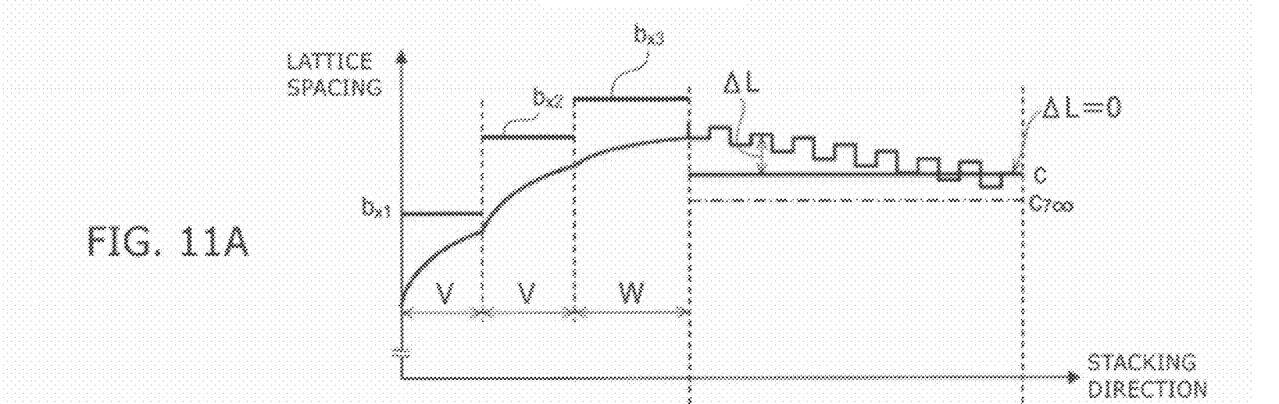
FIGS. 11A and 11B are schematic diagrams showing the variation of lattice spacing in the stacking direction of the superlattice structure and the light emitting layer according to a variation of the embodiment.
Figure 11B:
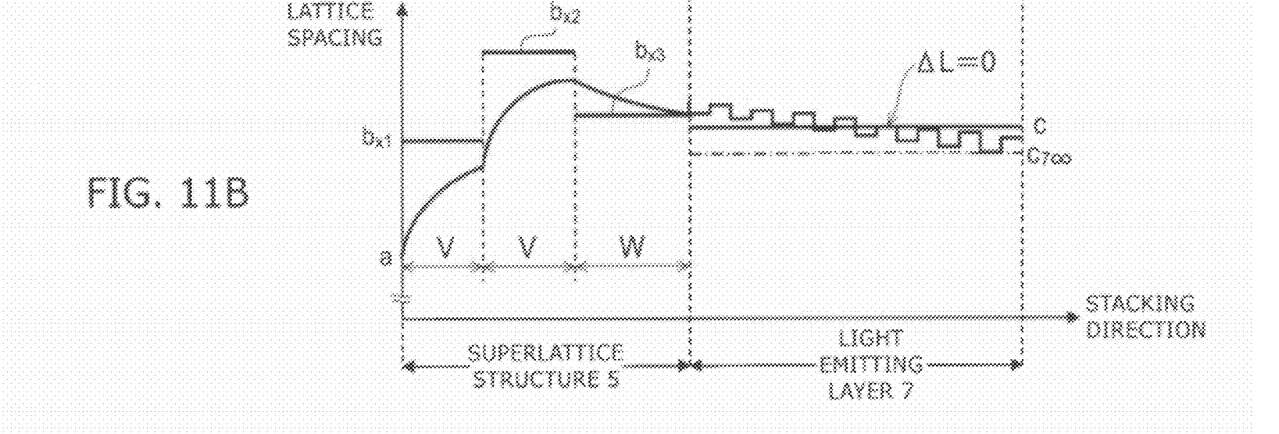

FIGS. 11A and 11B are schematic diagrams showing the variation of lattice spacing in the stacking direction of the superlattice structure 5 and the light emitting layer 7 according to a variation of the embodiment.

As shown in FIG. 11A, for instance, the superlattice structure 5 can be divided into three portions U, V, and W so that the In ratio (x) of the $In_xGa_{1-x}N$ layer 5b is increased successively in the stacking direction. The lattice constants $b_{x1}$, $b_{x2}$, and $b_{x3}$ of the superlattice structures U, V, and W can be configured to satisfy the following relation so that $b_{x3}$ is larger than the lattice constant c of $In_zGa_{1-z}N$ of the light emitting layer 7.

$$b_{x1} < b_{x2} < b_{x3} \qquad (15)$$

Thus, the lattice strain of the first $In_xGa_{1-x}N$ layer 5b in each superlattice structure can be decreased. This facilitates crystal growth.

Furthermore, as shown in FIG. 11B, the superlattice structures can be configured so that the lattice constant $b_{x2}$ in the superlattice structure V is maximized. In this case, the lattice spacing of the superlattice structure 5 is maximized in the last layer of the superlattice structure V. That is, the maximum of the lattice spacing in the superlattice structure 5 does not necessarily need to lie in the last layer of the superlattice structure 5, but may lie intermediately, as long as the lattice spacing of the last layer in the superlattice structure W on the light emitting layer 7 side is wider than the lattice constant c of the quantum well layer 7b of the light emitting layer 7.

The lattice spacing of the quantum well layer 7b can be made wider than the lattice constant c of $In_zGa_{1-z}N$ on the superlattice structure 5 side, and narrower than the lattice constant c of $In_zGa_{1-z}N$ on last layer side of the MQW structure. For instance, in the light emitting layer 7 of FIG. 11B, the quantum well layer with lattice strain $\Delta L=0$ is realized not in the last layer of the MQW structure, but in an intermediate quantum well layer 7b.

The lattice strain $\Delta L$ can be set to zero in an intermediate quantum well layer 7b by setting the difference between the lattice spacings $a_{5N}$, $b_{5N}$ in the last layer of the superlattice structure 5 and the lattice constant c of $In_zGa_{1-z}N$ to an appropriate value.

The invention has been described above with reference to the embodiments of the invention. However, the invention is not limited to these embodiments. For instance, those skilled in the art can modify the design and material based on the state of the art at the time of the application. Such modifications are also encompassed within the scope of the invention as long as they fall within the spirit of the invention.

Here, the superlattice structure includes structures in which materials having different lattice constants are stacked in combination. Depending on the number of stacked layers, the composition ratio and the film thickness can be changed.

The lattice relaxation ratio may be different between $In_xGa_{1-x}N$ (x=0.15-0.3) of the superlattice structure and $In_zGa_{1-z}N$ (z=0.1-0.15) of the light emitting layer. Furthermore, the structure for relaxing the strain can also be provided on the substrate side of the superlattice structure.

The "nitride semiconductor" referred to herein includes group III-V compound semiconductors of $B_xIn_yAl_zGa_{1-x-y-z}N$ ($0 \leq x \leq 1$, $0 \leq y \leq 1$, $0 \leq z \leq 1$, $0 \leq x+y+z \leq 1$), and also includes mixed crystals containing phosphorus (P) or arsenic (As) as a group V element besides N (nitrogen).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a first conductivity type semiconductor layer including a superlattice structure, first semiconductor layers and second semiconductor layers being alternately provided in the superlattice structure, the first semiconductor layers including a first nitride semiconductor and the second semiconductor layers including a second nitride semiconductor having a larger lattice constant than the first nitride semiconductor;
   a light emitting layer provided on the first conductivity type semiconductor layer and including a multi-quantum well structure, quantum well layers and barrier layers being alternately provided in the multi-quantum well structure, the quantum well layers including a third nitride semiconductor having a smaller lattice constant than the second nitride semiconductor and the barrier layers including a fourth nitride semiconductor having a smaller lattice constant than the third nitride semiconductor, at least one of the quantum well layers having lattice spacing equal to the lattice constant of the third nitride semiconductor; and
   a second conductivity type semiconductor layer provided on the light emitting layer.

2. The device according to claim 1, wherein the quantum well layer nearest to the second conductivity type semiconductor layer has the lattice spacing equal to the lattice constant of the third nitride semiconductor.

3. A semiconductor light emitting device comprising:
   a first conductivity type semiconductor layer including a superlattice structure, first semiconductor layers and second semiconductor layers being alternately provided in the superlattice structure, the first semiconductor layers including a first nitride semiconductor and the second semiconductor layers including a second nitride semiconductor having a larger lattice constant than the first nitride semiconductor;
   a light emitting layer provided on the first conductivity type semiconductor layer and including a multi-quantum well structure, quantum well layers and barrier layers being alternately provided in the multi-quantum well structure, the quantum well layers including a third nitride semiconductor having a smaller lattice constant than the second nitride semiconductor and the barrier layers including a fourth nitride semiconductor having a smaller lattice constant than the third nitride semiconductor, the quantum well layer on a side of the first conductivity type semiconductor layer having lattice spacing wider than the lattice constant of the third nitride semiconductor, the quantum well layer located at an end of the multi-quantum well structure opposite to the first conductivity type semiconductor layer having lattice spacing narrower than the lattice constant of the third nitride semiconductor; and a second conductivity type semiconductor layer provided on the light emitting layer.

4. The device according to claim 3, wherein at least one of the quantum well layers has lattice spacing equal to the lattice constant of the third nitride semiconductor.

5. The device according to claim 3, wherein a difference between lattice spacing in the quantum well layer nearest to the second conductivity type semiconductor layer and the lattice constant of the third nitride semiconductor is approximated to 0 (zero).

6. The device according to claim 3, wherein lattice spacing of a plurality of the first semiconductor layers included in the superlattice structure becomes wider toward the light emitting layer, and lattice spacing of a plurality of the second semiconductor layers included in the superlattice structure becomes wider toward the light emitting layer, and the lattice spacing of the second semiconductor layer nearest to the light emitting layer is wider than lattice spacing of the quantum well layers.

7. The device according to claim 3, wherein lattice spacing of a plurality of the quantum well layers included in the multi-quantum well structure becomes narrower toward the second conductivity type semiconductor layer, and lattice spacing of a plurality of the barrier layers included in the multi-quantum well structure becomes narrower toward the second conductivity type semiconductor layer.

8. The device according to claim 3, wherein the superlattice structure and the light emitting layer are continuously provided.

9. The device according to claim 3, wherein a lattice constant of the second semiconductor layers increases in stacking direction of the superlattice structure.

10. The device according to claim 3, wherein lattice spacing of the second semiconductor layers is maximized between a first layer of the second semiconductor layers and a last layer of the second semiconductor layers.

11. The device according to claim 3, wherein the first to fourth nitride semiconductors are $Al_x In_y Ga_{1-x-y} N$ ($0 \leq x \leq 1$, $0 \leq y \leq 1$, $0 \leq x+y \leq 1$) of different compositions respectively.

12. The device according to claim 11, wherein the second nitride semiconductor is $In_y Ga_{1-y} N$ ($0 \leq y \leq 1$), and the third nitride semiconductor is $In_z Ga_{1-z} N$ ($0 \leq z \leq 1$, $z < y$).

13. The device according to claim 12, wherein the first and fourth nitride semiconductors are GaN.

14. The device according to claim 13, wherein the second semiconductor layers are thicker than the first semiconductor layers.

15. The device according to claim 13, wherein the second nitride semiconductor has an In ratio of 0.2, and the third nitride semiconductor has an In ratio of 0.15.

16. The device according to claim 13, wherein the light emitting layer has a light emission wavelength of 450 nm, and the second nitride semiconductor has an In ratio of 0.24.

17. The device according to claim 13, wherein an In ratio of the second nitride semiconductor increases in stacking direction of the superlattice structure.

18. The device according to claim 13, wherein an In ratio of the second nitride semiconductor is maximized between a first layer of the second semiconductor layers and a last layer of the second semiconductor layers.

19. The device according to claim 3, further comprising:

a substrate located on a side of the first conductivity type semiconductor layer opposite to the light emitting layer; and a contact layer provided between the substrate and the first conductivity type semiconductor layer, including the first nitride semiconductor, and doped with first conductivity type impurity at a higher concentration than the first conductivity type semiconductor layer.

20. The device according to claim 3, wherein the second conductivity type semiconductor layer includes a GaN layer and an AlGaN layer provided between the light emitting layer and the GaN layer.

* * * * *